(12) United States Patent
Ali

(10) Patent No.: US 10,009,023 B2
(45) Date of Patent: Jun. 26, 2018

(54) METHOD AND APPARATUS FOR EDGE EQUALIZATION FOR HIGH SPEED DRIVERS

(71) Applicant: MediaTek Inc., Hsin-Chu (TW)

(72) Inventor: Tamer Ali, Irvine, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days. days.

(21) Appl. No.: 15/280,059

(22) Filed: Sep. 29, 2016

(65) Prior Publication Data
US 2017/0288665 A1 Oct. 5, 2017

Related U.S. Application Data

(60) Provisional application No. 62/317,900, filed on Apr. 4, 2016.

(51) Int. Cl.
| | |
|---|---|
| *H03K 3/00* | (2006.01) |
| *H03K 17/687* | (2006.01) |
| *H03K 5/134* | (2014.01) |
| *H04B 3/04* | (2006.01) |
| *H04L 25/02* | (2006.01) |
| *H03K 5/00* | (2006.01) |
| *H04B 1/04* | (2006.01) |

(52) U.S. Cl.
CPC ........ *H03K 17/6872* (2013.01); *H03K 5/134* (2014.07); *H04B 3/04* (2013.01); *H04L 25/02* (2013.01); *H03K 2005/00195* (2013.01); *H04B 1/04* (2013.01)

(58) Field of Classification Search
CPC .............. H03K 17/6872; H03K 5/134; H03K 2005/00195; H04L 25/02; H04B 3/04; H04B 1/04
See application file for complete search history.

(56) References Cited

U.S. PATENT DOCUMENTS

| | | | | |
|---|---|---|---|---|
| 4,829,199 A | * | 5/1989 | Prater .................. | G11C 7/1051 326/27 |
| 5,023,472 A | * | 6/1991 | Hashimoto .......... | H03K 17/163 326/21 |

(Continued)

OTHER PUBLICATIONS

Kocaman et al., A 3.8 mW/Gbps Quad-Channel 8.5-13 Gbps Serial LinkWith a 5 Tap DFE and a 4 Tap Transmit FFE in 28 nm CMOS; *IEEE Journal of Solid-State Circuits*, vol. 51, No. 4, pp. 881-892 (Apr. 2016).

(Continued)

*Primary Examiner* — Kenneth B Wells
(74) *Attorney, Agent, or Firm* — Wolf, Greenfield & Sacks, P.C.

(57) ABSTRACT

A line driver for signal equalization is described. The line driver may comprise an equalization driver and a gating circuit. The gating circuit may be configured to gate the equalization driver between a first transition and a second transition, such as between a rising edge and a falling edge. The gating circuit may comprise one or more delay elements, such as one or more inverters, configured to generate the second transition in response to receiving the first transition, where the second transition is delayed with respect to the first transition. Such line driver may be used to signals having high data rates to transmission lines, such as cables or metal connection on printed circuit boards.

17 Claims, 8 Drawing Sheets

(56) References Cited

U.S. PATENT DOCUMENTS

| | | | |
|---|---|---|---|
| 5,122,690 A * | 6/1992 | Bianchi | H03K 19/018528 326/27 |
| 6,759,868 B2 * | 7/2004 | Helt | H03K 19/00384 326/26 |
| 8,878,568 B1 | 11/2014 | Farzan et al. | |
| 2010/0117690 A1 * | 5/2010 | Doi | H03K 19/018528 327/108 |
| 2014/0117953 A1 | 5/2014 | Hoefler et al. | |
| 2015/0092829 A1 | 4/2015 | Ali et al. | |

OTHER PUBLICATIONS

Extended European Search Report for Application No. 17164388.5-1875 dated Aug. 7, 2017.

* cited by examiner

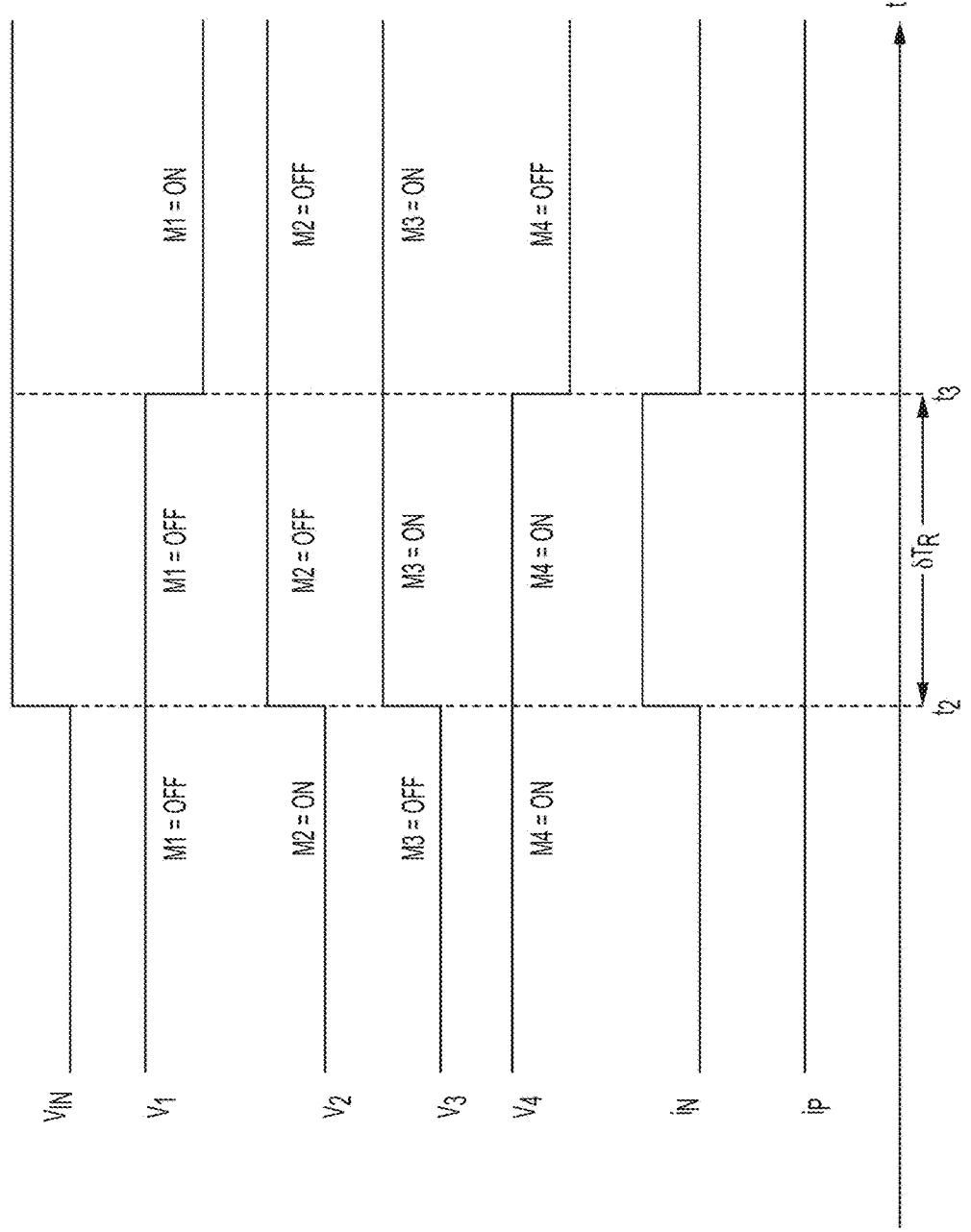

METHOD AND APPARATUS FOR EDGE EQUALIZATION FOR HIGH SPEED DRIVERS

RELATED APPLICATIONS

This application claims priority under 35 U.S.C. § 119(e) to U.S. Provisional Application Ser. No. 62/317,900, entitled "METHOD AND APPARATUS FOR EDGE EQUALIZATION FOR HIGH SPEED DRIVERS AND DACS" filed on Apr. 4, 2016, which is herein incorporated by reference in its entirety.

BACKGROUND

Line drivers are used in electronics to transmit signals through transmission lines. Types of line drivers include voltage mode drivers and current mode drivers.

SUMMARY

According to one aspect of the present application, a line driver is provided. The line driver may comprise a first driver connected to a transmission line and configured to drive the transmission line with a first output signal in response to receiving an input signal, a second driver connected to the transmission line and configured to drive the transmission line with a second output signal, and a gating circuit configured to activate the second driver for a period of time in response to receiving the input signal, wherein the second driver is configured to drive the transmission line for the period of time.

According to another aspect of the present application, a method for driving a transmission line is provided. The method may comprise using a first driver, driving the transmission line with a first output signal in response to receiving an input signal, activating, using a gating circuit, a second driver for a period of time in response to receiving the input signal, and driving the transmission line with a second output signal using the second driver for the period of time.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

FIG. 3C is a plot illustrating a plurality of control signals as obtained in response to receiving a falling edge, according to some embodiments.

DETAILED DESCRIPTION

The inventor has appreciated that line drivers for driving transmission lines may exhibit frequency responses that roll-off above a certain frequency, and as a result may introduce distortion (e.g., inter-symbol interference). The roll-off may be caused by the fact that the signals exhibit transitions that are not steep enough to support high data rates. A variety of factors may contribute to such non-steep transitions. For example, a line driver may exhibit a capacitance which may limit the speed of operation. Additionally, or alternatively, the capacitance associated with a transmission line may be the limiting factor.

The inventor has further appreciated that the distortion of driving signals that are transmitted through transmission lines, such as metal traces on printed circuit board or electric cables, may be reduced by driving the transmission line using parallel paths having different frequency responses. A slow-path may include a driver that drives the transmission line with DC and other low frequency signals. A fast-path may include another driver that drives the transmission line with higher frequency signals. The fast-path may include a gating circuit that pulses the fast-path driver into the on-state during transitions of the input signal. As a result, the distortion of the signals on the transmission line can be reduced. In some embodiments, the resulting driving signal may exhibit a frequency content that is capable of carrying high data rates (e.g., in excess of 25 Gb/s).

Providing the high frequencies described above may be performed by activating the fast-path during certain periods of time. By switching a driver on during such periods and off outside such periods, the fast-path driver may exhibit a frequency response comprising higher frequencies with respect to a driver that is continuously kept in its on-state. Accordingly, switching a driver on and off may shift the frequency response of the driver toward higher frequencies, thus obtaining a pass-band frequency response.

Figure 1:
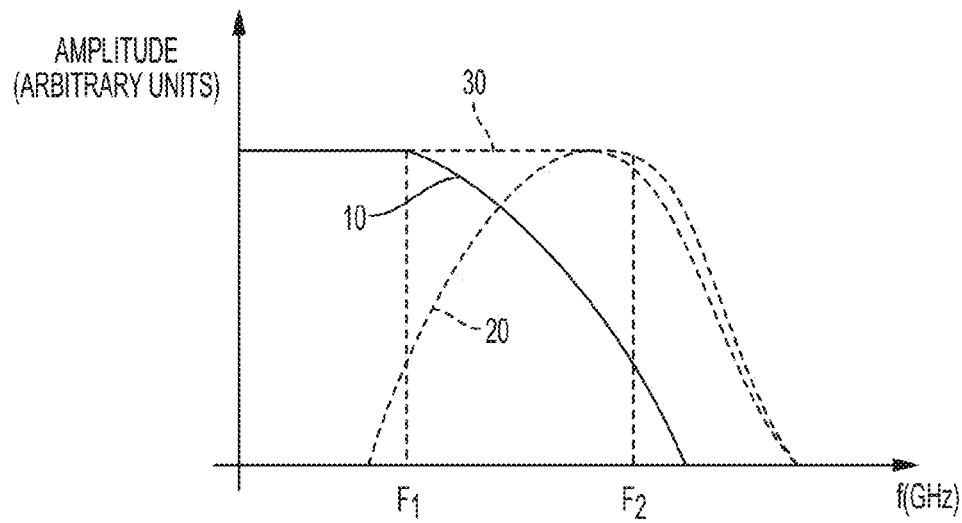
FIG. 1 is a plot illustrating a plurality of frequency responses, according to some embodiments.

Some conventional printed circuit boards may be fabricated using materials that may introduce an undesired impedance, thus causing the board to introduce distortion when driven with signals having high data rates. In spite of such impedances, it may be desirable to use these printed circuit boards due to the their accessibility and low cost. According to one aspect of the present application, driving transmission lines that exhibit such impedances while limiting distortion may be performed by using, in addition to a conventional driver, such as voltage mode drivers or current mode logic drivers, an equalization driver configured to drive the high-frequency components of a signal. FIG. 1 is a plot illustrating a comparison between the frequency response 10 of a conventional line driver and the frequency response 20 of an equalization driver of the type described herein. As illustrated, the frequency response 10 rolls-off above frequency $f_1$ (e.g., above 15 GHz or 25 GHz). On the other hand, the frequency response 20 may cover a frequency range that is above the frequency range of the conventional driver. In some embodiments, a line driver may be configured to combine the frequency response of a conventional driver with the frequency response of an equalization driver. One exemplary implementation of such line driver may result in the frequency response 30. The act of obtaining a frequency response 30 by combining frequency response 10 and 20 will be referred to herein as "signal equalization". Frequency response 30 may roll-off at a frequency $f_2$ greater than $f_1$. For example, frequency $f_2$ may be greater than 30 GHz, greater than 40 GHz, greater than 50 GHz, or greater than 60 GHz. Having extended the flat region of the frequency response, distortion of signals containing frequencies above $f_1$ may be limited.

In some embodiments, signal equalization may be performed by activating a driver for a predefined time period. For example, a gating circuit may activate a driver in response to receiving a transition, such as a rising edge or a falling edge. By limiting the period in which a driver is active, steep transitions may be allowed to be driven through the transmission line without experiencing distortion. The gating circuit may comprise one or more delay elements configured to delay signals by a desired amount. The amount by which the signal is delayed may determine the time period in which the equalization driver is activated.

Figure 2A:
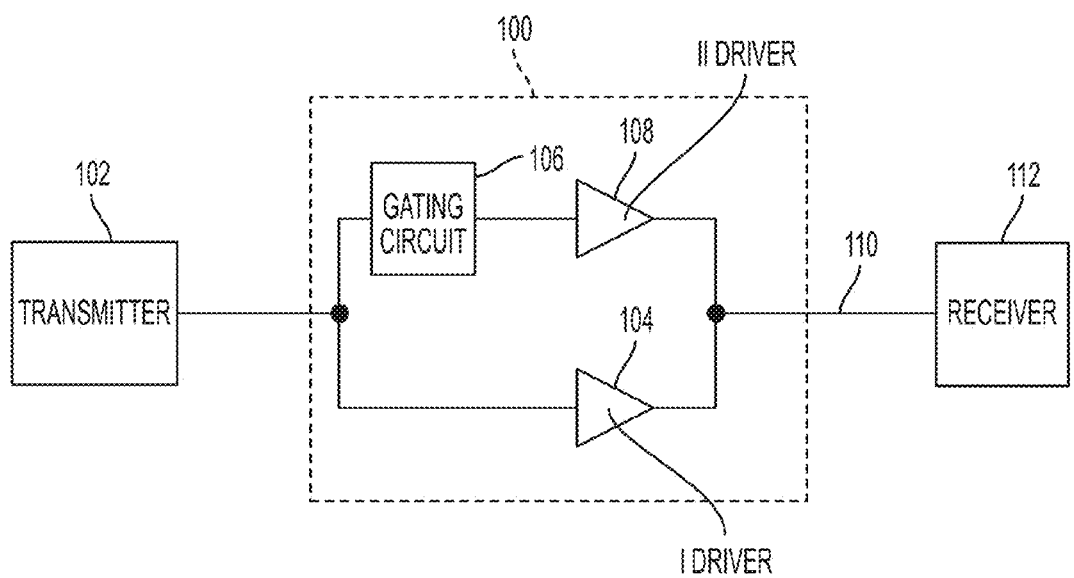
FIG. 2A is a block diagram illustrating a line driver, according to some embodiments.

FIG. 2A is a block diagram illustrating a line driver according to some non-limiting embodiments. Line driver 100 may be connected to a transmitter 102 and to a receiver 112. Transmitter 102 may be any suitable type of electronic device configured to transmit electrical signals. For example, transmitter 102 may comprise a processor, an analog-to-digital converter, a digital-to-analog converter, an amplifier, or a waveform generator. Receiver 112 may be any suitable type of electronic device configured to receive electrical signals. For example, receiver 112 may comprise an processor, an analog-to-digital converter, a digital-to-analog converter, an amplifier, an antenna, and/or an optical modulator for driving optical signals into an optical fiber. Line driver 100 may be connected to receiver 112 through transmission line 110. Transmission line 110 may comprise one or more metal connections on a printed circuit board or one or more cables, such as twinax cables or coax cables. Transmission line 110 may have a length that is comparable to the wavelength of the signal driving it.

Line driver 100 may comprise a conventional driver 104, such as voltage mode driver and/or a current mode logic driver. When connected to transmission line 110, driver 104 may exhibit frequency response 10 of FIG. 1. Line driver 100 may further comprise a gating circuit 106 and an equalization driver 108. The equalization driver may be configured to perform signal equalization. Equalization driver 108, when connected to transmission line 110, may exhibit frequency response 20 of FIG. 1. Gating circuit 106 may be configured to gate driver 108. As defined herein, the verb "to gate" may be used to indicate activation of a circuit. For example, in the gated state, driver 108 may be configured to allow signals provided by transmitter 102 to reach transmission line 110. In the ungated state, driver 108 may exhibit a large impedance, such that signals provided by transmitter 102 are blocked and do not reach transmission line 110.

Figure 2B:
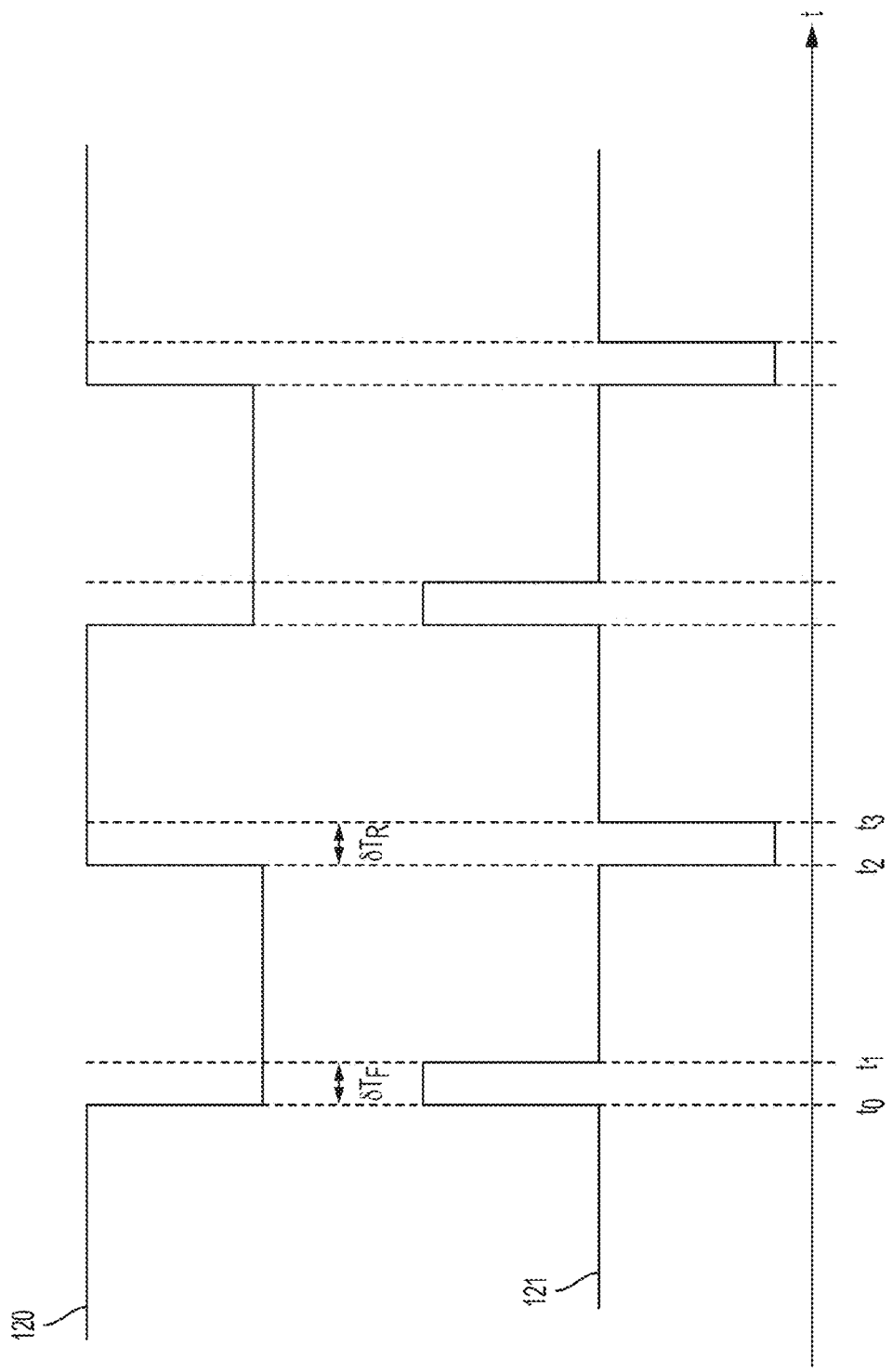
FIG. 2B is a plot illustrating examples of an input signal and an output signal, according to some embodiments.

FIG. 2B is a plot illustrating an input signal and an output signal, according to some embodiments. Input signal 120 may represent a signal generated by transmitter 102 and output signal 121 may represent a signal, such as a voltage or a current, as driven by equalization driver 108 to transmission line 110. Input signal 120 may toggle between two or more levels, such as between a logic 0 and a logic 1. Input signal 120 may exhibit a plurality of transitions. For example, input signal 120 may exhibit a falling edge at time $t_0$ and a rising edge at time $t_2$. In response to receiving the falling edge occurring at $t_0$, gating circuit 106 may gate driver 108. As a result, output signal 121 may toggle to a first state, such a high-state, at $t_0$. Upon receiving the falling edge of input signal 120, the gating circuit may continue to gate driver 108 for a time period $\delta T_F$. Time period $\delta T_F$ may be greater than 10 fs, greater than 100 fs, greater than 1 ps, greater than 5 ps, greater than 10 ps, greater than 20 ps, greater than 30 ps or greater than 50 ps. Time period $\delta T_F$ may be less than 10 fs, less than 1 ns, less than 500 ps, less than 100 ps, less than 50 ps, less than 30 ps, less than 20 ps, less than 10 ps or less than 1 ps. Time period $\delta T_F$ may be between 10 fs and 100 ps in some embodiments. At $t_1$, output signal 121 may toggle back to a floating state.

In response to receiving the rising edge of input signal 120 occurring at $t_2$, gating circuit 106 may gate driver 108. As a result, output signal 121 may toggle to a second state, such a low-state, at $t_2$. Upon receiving the rising edge, the gating circuit may continue to gate driver 108 for a time period $\delta T_R$. Time period $\delta T_R$ may be equal to time period $\delta T_F$ in some embodiments. Time period $\delta T_R$ may be greater than 10 fs, greater than 100 fs, greater than 1 ps, greater than 5 ps, greater than 10 ps, greater than 20 ps, greater than 30 ps or greater than 50 ps. Time period $\delta T_R$ may be less than 10 fs, less than 1 ns, less than 500 ps, less than 100 ps, less than 50 ps, less than 30 ps, less than 20 ps, less than 10 ps, or less than 1 ps. Time period $\delta T_R$ may be between 10 fs and 100 ps in some embodiments. At $t_3$, output signal 121 may toggle back to a floating state.

In some embodiments, gating circuit 106 may comprise one or more delay elements. A delay element of the type described herein may be configured to receive a first transition, such as rising edge or a falling edge, and to generate a second transition after a predefined time period. The time delay may be implemented using inverters in some embodiments. In this case, when a transition is received (e.g., a falling edge), the opposite transition (e.g., a rising edge) is generated with a delay. In some embodiments, gating circuit 106 may gate driver 108 between the first transition and the second transition.

Figure 3A:
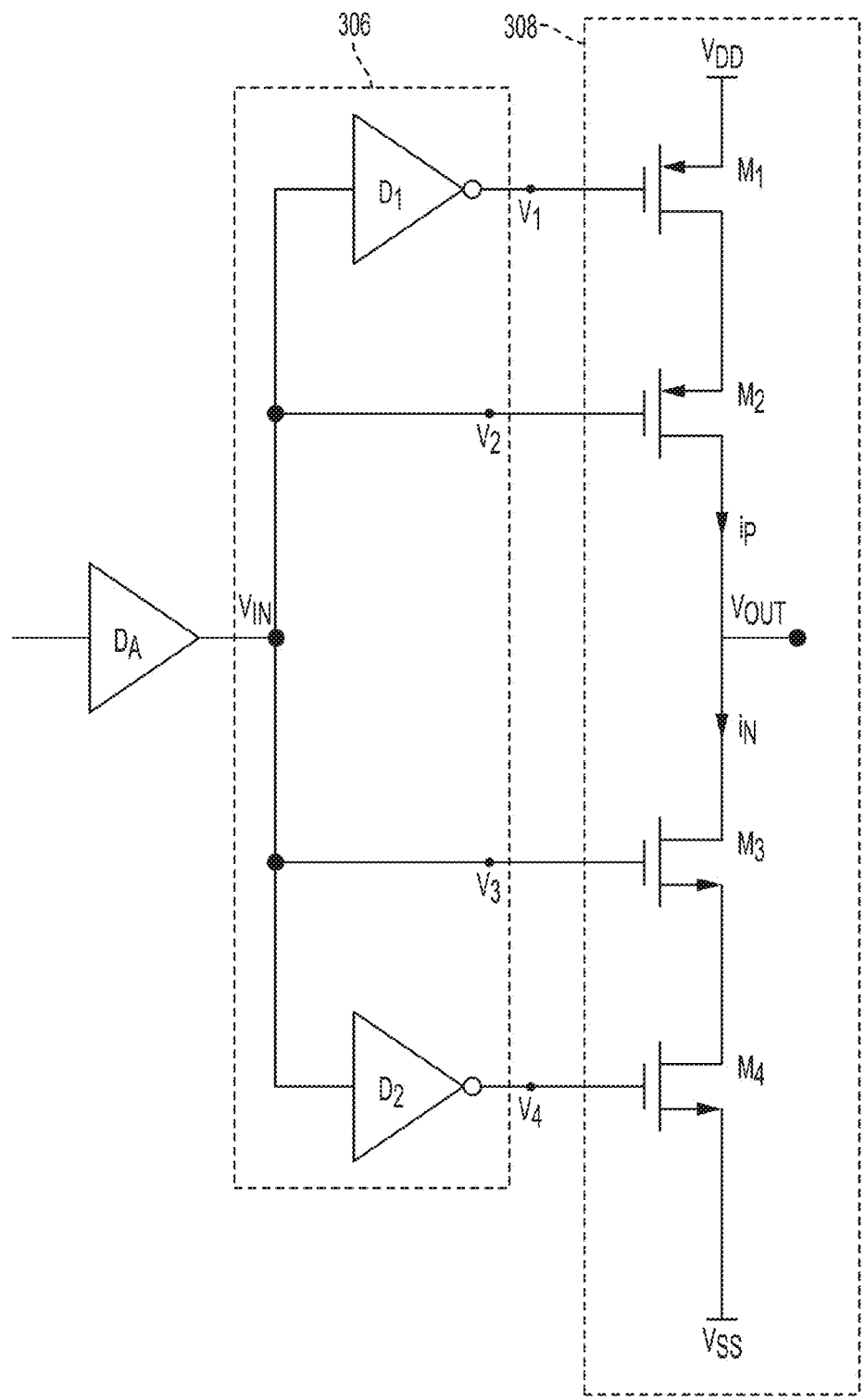
FIG. 3A is a circuit diagram illustrating a driver and a gating circuit, according to some embodiments.

FIG. 3A is a circuit diagram illustrating a gating circuit 306 and driver 308, according to some embodiments. Gating circuit 306 may serve as a gating circuit 106 and driver 308 may serve as a driver 108. Gating circuit 306 may be connected to transmitter 102 through a driver $D_A$. Driver $D_A$ may be configured to provide input signal $V_{in}$ to the gating circuit. Gating circuit 306 may comprise one or more delay elements. In some embodiments, the delay elements may be implemented using inverters, such as inverters $D_1$ and $D_2$. The inverters may be configured to receive a transition, and to provide the opposite transition with a delay.

Driver 308 may comprise a plurality of transistors, such as transistors $M_1$, $M_2$, $M_3$ and $M_4$. The transistors may be connected in series to one another. For example, the drain of transistor $M_1$ may be connected to the source of transistor $M_2$, the drain of transistor $M_2$ may be connected to the drain of transistor $M_3$, the source of transistor $M_3$ may be connected to the drain of transistor $M_4$. In some embodiments, transistors $M_1$ and $M_2$ may have a first type of conductivity and transistors $M_3$ and $M_4$ may have a second type of conductivity. For example, transistors $M_1$ and $M_2$ may be PMOS transistors and transistors $M_3$ and $M_4$ may be NMOS transistors. It should be appreciated that the transistors of driver 308 are not limited to metal-oxide-semiconductor field effect transistors (MOSFET) as any other suitable type of transistors may be used. For example, bipolar junction transistors (BJT), junction field effect transistors (JFET), heterojunction bipolar transistor (HBT), etc. may be used.

The voltages present at the gates of transistors $M_1$, $M_2$, $M_3$ and $M_4$ will be referred to herein respectively as $V_1$, $V_2$, $V_3$ and $V_4$. In some embodiments, $V_2$ and $V_3$ may be equal to $V_{in}$, and $V_1$ and $V_4$ may be inverted, delayed versions of $V_{in}$. The output voltage $V_{out}$ represents the voltage driven to the transmission line (not shown in FIG. 3A). Current $i_p$ represents the current flowing through voltage supplier $V_{DD}$, transistors $M_1$ and $M_2$, and the transmission line. Current $i_N$ represents the current flowing through voltage supplier $V_{SS}$, transistors $M_3$ and $M_4$, and the transmission line.

Figure 3B:
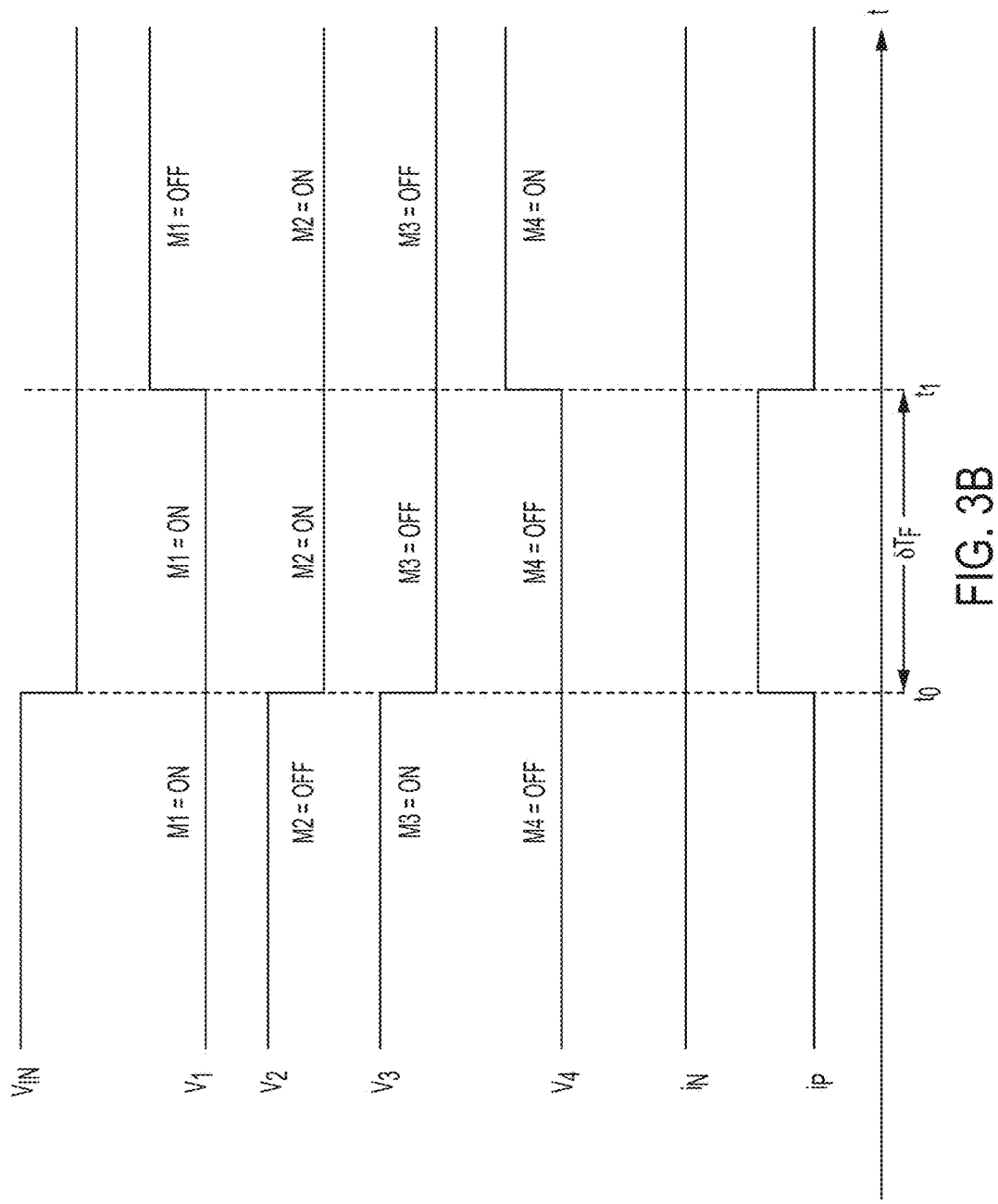
FIG. 3B is a plot illustrating a plurality of control signals as obtained in response to receiving a rising edge, according to some embodiments.

Voltages $V_1$, $V_2$, $V_3$ and $V_4$ may be configured to enable current $i_p$ to flow into the transmission line for a predefined period of time, such as between $t_0$ and $t_1$. Additionally, voltages $V_1$, $V_2$, $V_3$ and $V_4$ may be configured to enable current $i_N$ to flow into the transmission line for a predefined period of time, such as between $t_2$ and $t_3$. FIG. 3B is a plot illustrating the signals of driver 308 in response to a falling edge, according to some embodiments. At $t_0$, input signal $V_{in}$ exhibits a falling edge. In response to receiving the falling edge, driver $D_1$ may provide a rising edge at $t_1$, where $t_1$ is delayed with respect to $t_0$ by $\delta T_F$. Before $t_1$, being $V_1$ equal to a logic 0 (e.g., equal to $V_{SS}$), the source-gate voltage of transistor $M_1$ may be, in absolute value, greater than its threshold voltage. As a result, transistor $M_1$ may be in an ON state (e.g., in saturation or in the linear regime) before $t_1$. When the gate of transistor $M_1$ receives a rising edge from driver $D_1$, transistor $M_1$ may be placed in an OFF state (e.g., below threshold). Voltages $V_2$ and $V_3$ may track input signal $V_{in}$. Before $t_0$, transistor $M_2$ may be in an OFF state, while transistor $M_3$ may be in a ON state. When the falling edge is received, transistor $M_2$ may be placed in an ON state and transistor $M_3$ may be placed in an OFF state. In response to receiving the falling edge, driver $D_2$ may provide a rising edge at $t_1$. As a result, transistor $M_4$ may be in an OFF state before $t_1$ and in an ON state after $t_1$.

As illustrated in FIG. 3B, transistors $M_1$ and $M_2$ may be both in an ON state between $t_0$ and $t_1$, thus allowing current $i_p$ to flow through the transmission line. Accordingly, output signal $V_{out}$ may increase to $V_{DD}$.

FIG. 3C is a plot illustrating the signals of driver 308 in response to a rising edge, according to some embodiments. At $t_2$, input signal $V_{in}$ exhibits a rising edge. In response to receiving the rising edge, driver $D_1$ may provide a falling edge at $t_3$, where $t_3$ is delayed with respect to $t_1$ by $\delta T_R$. As a result, transistor $M_1$ may be in an OFF state before $t_3$. When the gate of transistor $M_1$ receives a falling edge from driver $D_1$, transistor M1 may be placed in an ON state. Voltages $V_2$ and $V_3$ may track input signal $V_{in}$. Before $t_0$, transistor $M_2$ may be in an ON state, while transistor $M_3$ may be in a OFF state. When the rising edge is received, transistor $M_2$ may be placed in an OFF state and transistor $M_3$ may be placed in an ON state. In response to receiving the rising edge, driver $D_2$ may provide a falling edge at $t_3$. As a result, transistor $M_4$ may be in an ON state before $t_3$ and in an OFF state after $t_3$.

As illustrated in FIG. 3C, transistors $M_3$ and $M_4$ may be both in an ON state between $t_2$ and $t_3$, thus allowing current $i_N$ to flow through the transmission line. Accordingly, output signal $V_{out}$ may decrease to $V_{SS}$.

Figure 3D:
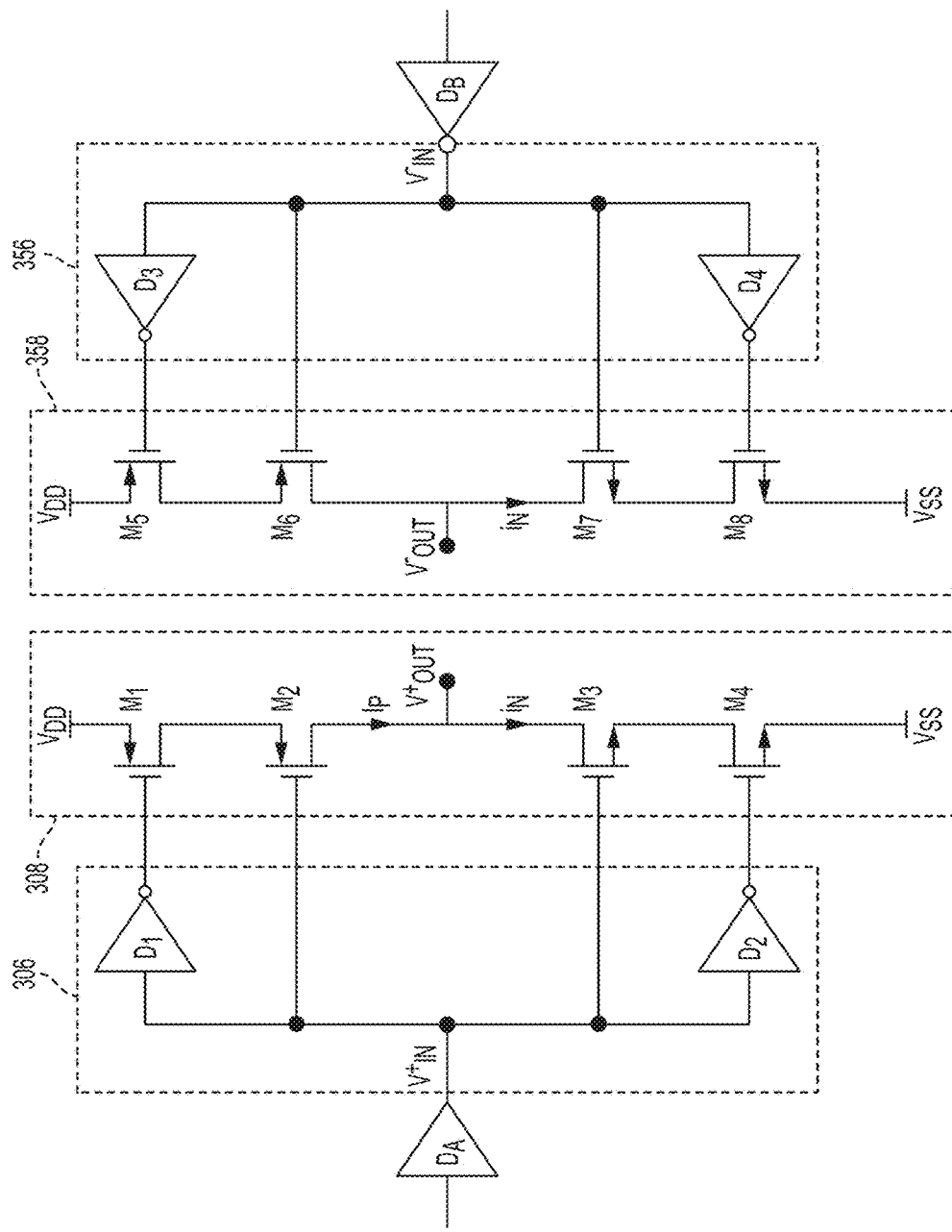
FIG. 3D is a circuit diagram illustrating a pair of driver and a gating circuits configured to operate differentially, according to some embodiments.

In some embodiments, driver 108 may be configured to operate differentially. In such embodiments, transmitter 102 may provide a pair of differential input signals, and the transmission line may be driven with a pair of differential output signals. FIG. 3D is a circuit diagram of a driver configured to operate differentially. As illustrated, gating circuit 306 and driver 308 may be used. In addition, a second gating circuit 356 and a second driver 358 may be used.

Gating circuit 356 and driver 358 may operate in the same manner as gating circuit 306 and driver 308 respectively. Driver $D_A$ may provide input signal $V_{in}^+$ to gating circuit 306, and driver $D_B$ may provide input signal $V_{in}^-$ to gating circuit 356. Input signals $V_{in}^+$ and $V_{in}^-$ may form a pair of differential signals. When $V_{in}^+$ exhibits a falling edge, output signal $V_{out}^+$ may be increased to $V_{DD}$ and output signal $V_{out}^-$ may be decreased to $V_{SS}$. Contrarily, when $V_{in}^-$ exhibits a falling edge, output signal $V_{out}^+$ may be decreased to $V_{SS}$ and output signal $V_{out}^-$ may be increased to $V_{DD}$.

Figure 4:
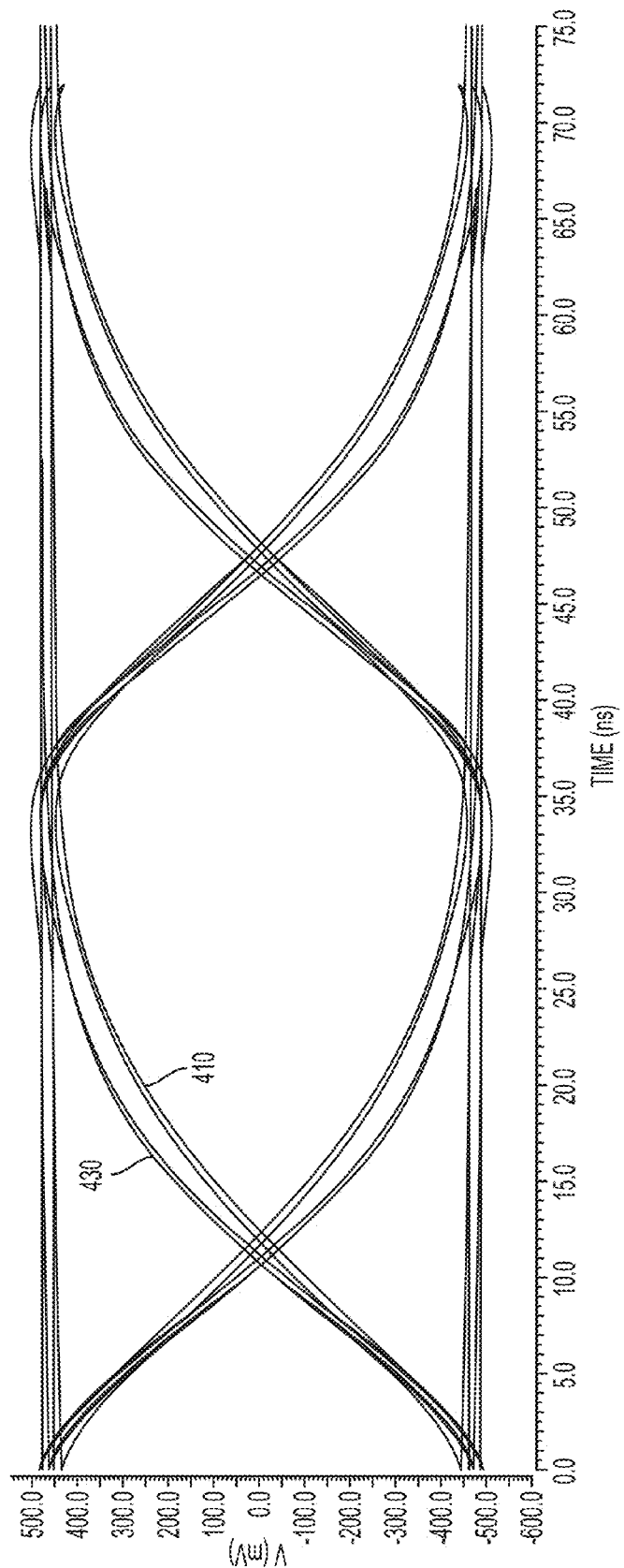
FIG. 4 is a plot illustrating a plurality of eye diagrams, according to some embodiments.

Using line driver 100 may provide one or more benefits. For example, compared to a conventional driver, a line driver of the type described herein may provide a lower inter-symbol interference. Inter-symbol interference may occur when a transition, such as a falling edge and/or a rising edge, is not very steep. One way to evaluate the steepness of a transition is to analyze an eye diagram. An eye diagram is an oscilloscope display in which a digital signal from a receiver is repetitively sampled and applied to the vertical input, while the data rate is used to trigger the horizontal sweep. Eye diagrams are commonly used in telecommunications to analyze the properties of a digital signal. FIG. 4 is a plot illustrating an eye diagram 410 of a conventional driver, such as driver 104 when used individually, with an eye diagram 430 of a line driver 100. As illustrated, the transitions associated with eye diagram 430 are steeper than the transitions associated with eye diagram 410. As a result, eye diagram 430 is more open than eye diagram 410 in the horizontal direction and in the vertical direction. Opening the eye diagram in the horizontal direction leads to a lower inter-symbol interference.

Figure 5:
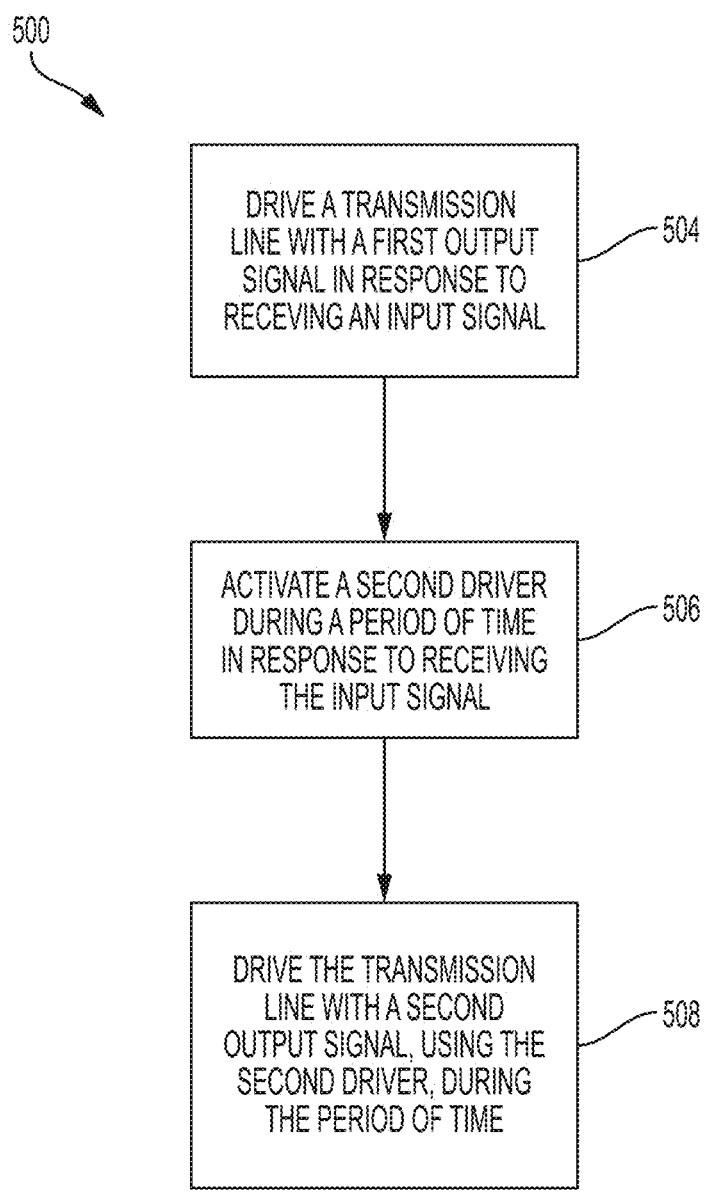
FIG. 5 is a flowchart illustrating a method for driving a transmission line, according to some embodiments.

FIG. 5 is a flow chart illustrating a method for driving a transmission line, according to some embodiments. Method 500 may begin at act 504, in which, in response to receiving an input signal, a first output signal may be driven through the transmission line. The input signal may be provided by transmitter 102, and the first output signal may be driven through the transmission line using driver 104.

At act 506, in response to receiving the input signal, gating circuit 106 may activate driver 108. In some embodiments, activation of driver 108 may be performed, using gating circuit 106, by generating a second transition when the input signal exhibits a first transition, such that the second transition is delayed with respect to the first transition, and by providing the first and second transitions to driver 108. In such embodiments, driver 108 may be activated between the first and the second transition.

At act 508, a second output signal may be driven through the transmission line, using driver 108, during the period of time in which driver 108 is activated. For example, driver 108 may be activated between the first transition and the second transition. By driving the transmission line with the first output signal and the second output signal, inter-symbol transition may be limited.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A line driver comprising:
   a first driver connected to a transmission line and configured to drive the transmission line with a first output signal in response to receiving an input signal;
   a second driver connected to the transmission line and configured to drive the transmission line with a second output signal, the second driver comprising first, second, third and fourth transistors connected in series with another, wherein the first and second transistors have a first conductivity type and the third and fourth transistors have a second conductivity type; and
   a gating circuit configured to activate the second driver for a period of time in response to receiving the input signal, the gating circuit comprising:
      a first delay element coupled to the first transistor, wherein the first delay element is configured to introduce a first time delay in the input signal between a gate of the first transistor and a gate of the second transistor, and
      a second delay element coupled to the fourth transistor, wherein the second delay element is configured to introduce a second time delay in the input signal between a gate of the third transistor and a gate of the fourth transistor;
   wherein the second driver is configured to drive the transmission line for the period of time.

2. The line driver of claim 1, wherein when the input signal exhibits a first transition, the gating circuit is configured to generate a second transition, the second transition being delayed with respect to the first transition, and wherein the period of time is from the first transition to the second transition.

3. The line driver of claim 2, wherein the first transition comprises a rising edge and the second transition comprises a falling edge.

4. The line driver of claim 1, wherein the first time delay and the second time delay are equal to each other.

5. The line driver of claim 1, wherein the period of time is between 10 ps and 30 ps.

6. The line driver of claim 1, wherein the first output signal varies at a first maximum frequency and the second output signal varies at a second maximum frequency, and wherein the second maximum frequency is greater than the first maximum frequency.

7. The line driver of claim 1, wherein the third and fourth transistors are NMOS transistors and the first and second transistors are PMOS transistors.

8. The line driver of claim 1, wherein the second driver is differential.

9. The line driver of claim 1, wherein the transmission line comprises a metal connection on a printed circuit board.

10. The line driver of claim 1, wherein the first driver comprises a voltage mode driver.

11. A method for driving a transmission line, the method comprising:
    using a first driver, driving the transmission line with a first output signal in response to receiving an input signal;
    activating, using a gating circuit having first and second delay elements, a second driver for a period of time in response to receiving the input signal, the second driver comprising first, second, third and fourth transistors connected in series with another, wherein the first and second transistors have a first conductivity type and the third and fourth transistors have a second conductivity type, wherein activating, using the gating circuit, the second driver for the period of time in response to receiving the input signal comprises:
       delaying, with the first delay element, delivery of the input signal to the first transistor relative to the second transistor, and
       delaying, with the second delay element, delivery of the input signal to the fourth transistor relative to the third transistor; and
    driving the transmission line with a second output signal using the second driver for the period of time.

12. The method of claim 11, wherein the period of time is less than a periodicity of the input signal.

13. The method of claim 11, wherein activating the second driver comprises generating, with the gating circuit, a second transition when the input signal exhibits a first transition, wherein the second transition is delayed with respect to the first transition, and wherein the period of time is from the first transition to the second transition.

14. The line driver of claim 13, wherein the first transition comprises a rising edge and the second transition comprises a falling edge.

15. The method of claim 11, wherein the period of time is between 10 ps and 30 ps.

16. The method of claim 11, wherein the first output signal varies at a first maximum frequency and the second output signal varies at a second maximum frequency, and wherein the second maximum frequency is greater than the first maximum frequency.

17. The method of claim 11, wherein the second signal driver is differential.

* * * * *

UNITED STATES PATENT AND TRADEMARK OFFICE
CERTIFICATE OF CORRECTION

| | |
|---|---|
| PATENT NO. | : 10,009,023 B2 |
| APPLICATION NO. | : 15/280059 |
| DATED | : June 26, 2018 |
| INVENTOR(S) | : Tamer Mohammed Ali |

It is certified that error appears in the above-identified patent and that said Letters Patent is hereby corrected as shown below:

In the Claims

In Claim 17, Column 8, Line 53, delete "signal"

Signed and Sealed this
Nineteenth Day of March, 2019

Andrei Iancu
*Director of the United States Patent and Trademark Office*